United States Patent
Harvey et al.

(10) Patent No.: US 7,687,391 B2
(45) Date of Patent: Mar. 30, 2010

(54) ELECTRICALLY OPTIMIZED AND STRUCTURALLY PROTECTED VIA STRUCTURE FOR HIGH SPEED SIGNALS

(75) Inventors: Paul M. Harvey, Austin, TX (US); Kazushige Kawasaki, Shiga (JP); Gen Yamada, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 11/535,700

(22) Filed: Sep. 27, 2006

(65) Prior Publication Data

US 2008/0073796 A1    Mar. 27, 2008

(51) Int. Cl.
*H01L 21/4763* (2006.01)
(52) U.S. Cl. .................. 438/622; 257/758
(58) Field of Classification Search ........... 257/774; 438/622
See application file for complete search history.

(56) References Cited

U.S. PATENT DOCUMENTS

| | | | |
|---|---|---|---|
| 2,966,719 A | | 1/1961 | Park, Jr. |
| 7,012,019 B2 * | | 3/2006 | Hsu et al. ............ 438/618 |
| 7,211,897 B2 * | | 5/2007 | Yamanoue et al. ...... 257/758 |
| 7,291,916 B2 * | | 11/2007 | Hsu et al. ............ 257/738 |
| 2004/0207094 A1 * | | 10/2004 | Sugizaki et al. ........ 257/774 |
| 2006/0065434 A1 | | 3/2006 | Hsu et al. |

FOREIGN PATENT DOCUMENTS

CN    1499626 A    5/2004

OTHER PUBLICATIONS

Mallik et al., "Advanced Package Technologies for High-Performance Systems", Intel Technology Journal, vol. 9, Issue 04, Published Nov. 9, 2005, http://developer.intel.com/technology/itj/index.htm, pp. 259-272.

Na et al., "Discontinuity impacts and design considerations of high speed differential signals in FC-PBGA packages with high wiring density", IBM Corporation, IEEE, 2005, pp. 107-110.

* cited by examiner

*Primary Examiner*—Brook Kebede
*Assistant Examiner*—Tony Tran
(74) *Attorney, Agent, or Firm*—Francis Lammes; Stephen J. Walder, Jr.; Jill A. Poimboeuf (57) ABSTRACT

An electrically optimized and structurally protected micro via structure for high speed signals in multilayer interconnection substrates is provided. The via structure eliminates the overlap of a contact with the reference planes to thereby reduce the via capacitance and thus, the via impedance mismatch in the via structure. As a result, the via structure is electrically optimized. The via structure further comprises one or more floating support members placed in close proximity to the via within a via clearance area between the via and the reference planes. The floating support members are "floating" in the sense that they are not in electrical contact with either the via or the reference planes. Thus, they are not provided for purposes of signal propagation but only for structural support. The floating support members may be connected to one another by way of one or more microvia structures.

12 Claims, 4 Drawing Sheets

ELECTRICALLY OPTIMIZED AND STRUCTURALLY PROTECTED VIA STRUCTURE FOR HIGH SPEED SIGNALS

BACKGROUND

1. Technical Field

The present application relates generally to an improved integrated circuit device package. More specifically, the present application is directed to an electrically optimized and structurally protected via structure for high speed signals in multilayer interconnection substrates, such as printed circuit boards, multilayer ceramic packages, and multilayer organic packages.

2. Description of Related Art

Current multilayer interconnection substrates, such as multilayer organic packages or multilayer ceramic packages, and printed circuit board (PCB) constructions require one or more external conductive layers, e.g., circuitry and/or pads for mounting components thereon, and, given today's increased functional demands, a plurality of internal conductive planes, e.g., signal, power and/or ground. To provide effective interconnections between components and the multilayer interconnection substrate's conductive circuitry and pads, the use of through holes has been adopted wherein several such holes are passed through the multilayer interconnection substrate and electrically coupled in a selective manner to internal and external conductive elements. Such holes typically include a conductor, such as copper, which may fill or at least layer the hole. The conductor in turn contacts circuitry and pads of selective layers of the multilayer interconnection substrate, which also are typically formed of a copper material.

The term "through hole" or simply "hole" as used herein is meant to include both conductive and non-conductive apertures which may extend entirely through the multilayer interconnection substrate, or only partly there-through, including between two or more internal layers without being externally exposed. Such "through holes" or "holes" are often referred to as "vias" in the art and thus, the term "via" will be used hereafter in the present description.

In modern multilayer interconnection substrate technologies, a problem exists with the via structures in that there typically is an impedance mismatch between the transmission line and the via structure. Such mismatch occurs due to capacitive affects in the via structure, as described hereafter. Such impedance mismatch causes signals to not be propagated through the via structure correctly. There is greater signal reflection at portions of the via structure where there is greater impedance mismatch and less signal reflection at portions of the via structure where there is less impedance mismatch. Thus, it is important to match the impedance across the via structure as much as possible, i.e. within a tolerable error.

Figure 1A:
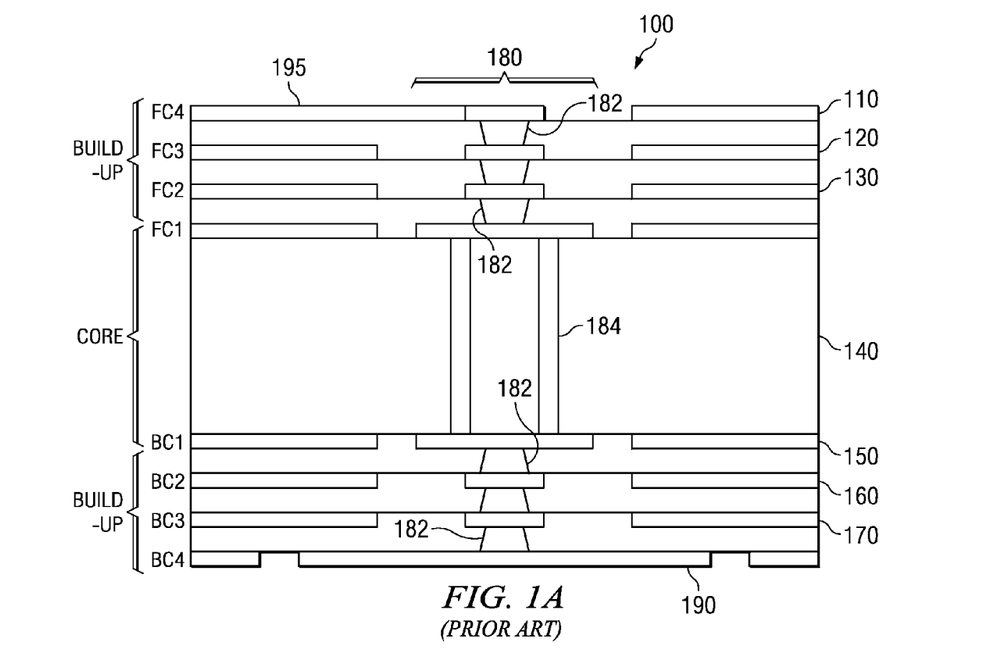
FIGS. 1A and 1B are exemplary cross-sectional diagrams of a known via arrangement in a multilayer interconnection substrate.
Figure 1B:
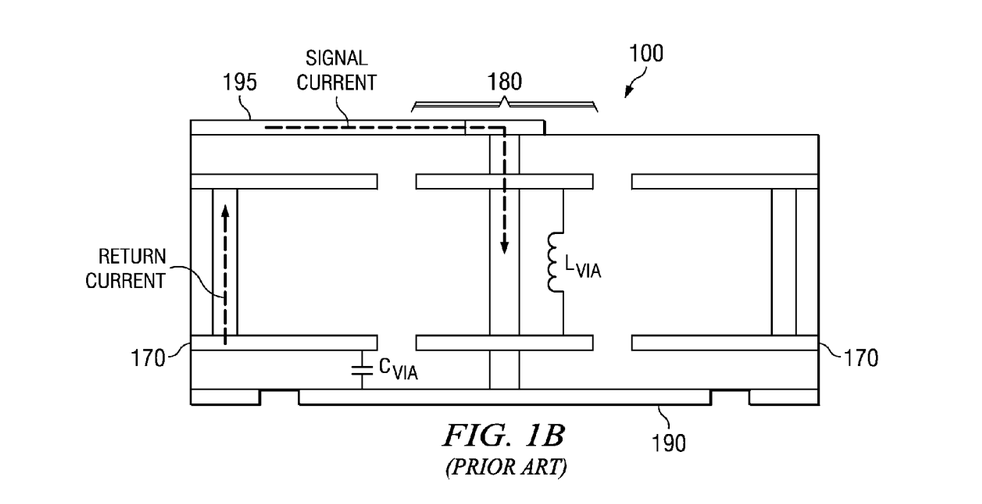

FIGS. 1A and 1B are exemplary cross-sectional diagrams of a known via arrangement in a multilayer interconnection substrate, e.g., printed circuit board, multilayer organic package, or multilayer ceramic package. In this via arrangement there is a significant amount of impedance mismatch, as discussed hereafter with regard to FIGS. 1A and 1B.

As shown in FIG. 1A, the multilayer interconnection substrate 100 includes a plurality of layers 110-170 and a via structure 180 that passes through each of the layers. The layer 140 is a core layer of the multilayer interconnection substrate 100 with layers 110-130 and 150-170 being build up layers. A ball grid array (BGA) pad 190 is provided on one external surface of the multilayer interconnection substrate 100.

As shown in FIG. 1A, the layers 110-130 are signal layers, or signal planes, in which signal transmission lines may be provided. Layers 150-170 are reference layers or reference planes that provide either voltage or ground connections. Typically, layers 150-170 alternate between voltage and ground reference planes. The via structure 180 comprises a plurality of microvias 182 provided at each layer and a plated through hole (PTH) 184. The microvia 182 are coupled to one another and to the PTH 184 to thereby provide a conductive pathway from one layer to another of the multilayer interconnection substrate 100. A signal transmission line 195 may be placed in contact with the via structure 180 to thereby permit passing of the signal from one layer of the multilayer interconnection substrate 100 to another or to an externally mounted integrated circuit device via BGA pad 190. The BGA pad is a necessarily large feature to accommodate a large solder ball that serves as the interconnect between the IC package and the next-level circuitry, typically a printed circuit board.

With reference now to FIG. 1B, a simplified cross section illustrating a conventional via structure is provided to illustrate the affects of the structure on via impedance. As shown in FIG. 1B, signal current is passed along the signal transmission line 195 and through the via structure 180 to the BGA pad 190. The via structure 180 has an inductance $L_{via}$. In addition, the via structure 180 has a capacitance $C_{via}$ due to the overlap of the BGA pad 190 and one or more reference planes, e.g., voltage and/or ground layers or planes. The impedance of the via structure 180 may be calculated using the following relationship:

$$Z_{via} = \text{sqrt}(L_{via}/C_{via})$$

where $Z_{via}$ is the via structure 180 impedance, $L_{via}$ is the total inductance through the via structure 180, and $C_{via}$ is the total capacitance between the via structure 180 and a reference plane.

The value for $L_{via}$ is determined by the signal to ground via pitch. The value for $C_{via}$ is determined primarily by the overlap area between the BGA pad 190 and a reference plane. $C_{via}$ may be approximated using the following relationship:

$$C_{via} \approx \in (S/d)$$

where $\in$ is a dielectric constant, d is a dielectric thickness between the BGA pad 190 and the reference plane, and S is an overlap area between the BGA pad 190 and the reference plane.

The via structure 180 in FIGS. 1A and 1B has a significant mismatch of the impedance value for the via $Z_{via}$. For example, if a target impedance value is 100 ohms, this impedance may be achieved at the signal transmission line 195 since there is a minimal capacitive affect at this point in the via structure 180. However, at the BGA pad 190, due to the capacitive affect, i.e. $C_{via}$, between the BGA pad 190 and the reference plane 170, using the equation for $Z_{via}$ above, since the capacitance is greater at this point in the via structure 180, the impedance is significantly less. Thus, there is a mismatch in the impedance of the via structure 180 causing greater reflection at certain points of the structure than at other points.

It can be seen from the above that the via impedance $Z_{via}$ may be controlled by controlling the amount of overlap of the BGA pad 190 and the reference plane, i.e. controlling the overlap area S and thus, the via capacitance $C_{via}$. By decreasing the capacitance $C_{via}$, the mismatch in the impedance $Z_{via}$ is reduced.

Figure 2:
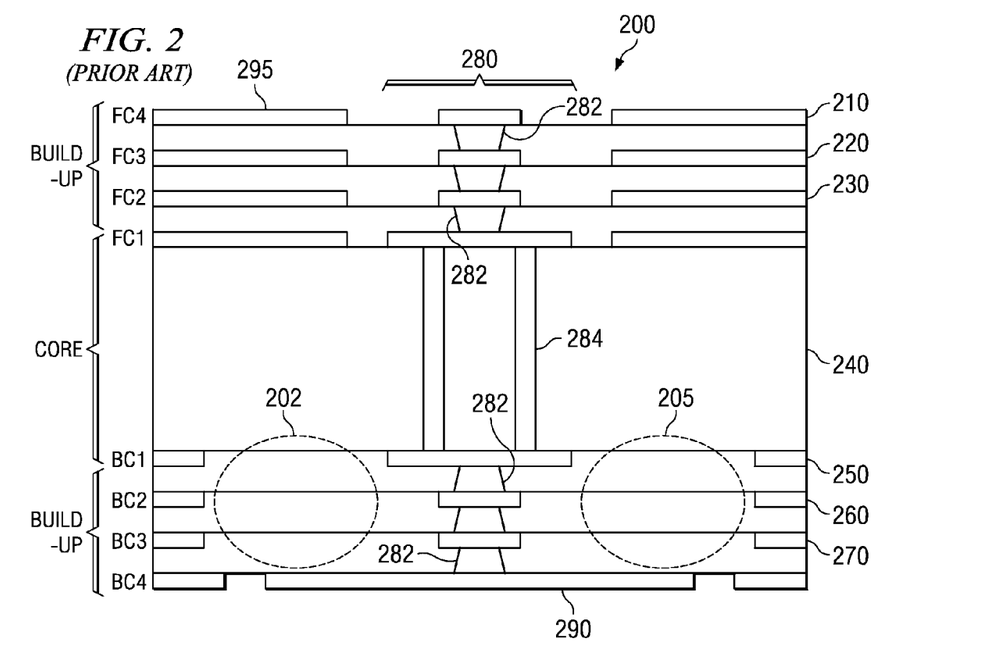
FIG. 2 is an exemplary diagram illustrating a known alternative via structure in which impedance mismatch is reduced.

In order to control the via impedance $Z_{via}$, and thereby reduce the mismatch in impedance, an alternative via structure has been developed that minimizes the overlap area between the BGA pad and the reference plane. FIG. 2 is an exemplary diagram illustrating this known alternative via structure. As shown in FIG. 2, the via structure is virtually identical to the structure shown in FIG. 1A with the exception that there is a large clearance hole provided between the reference planes 250-270, i.e. ground and voltage reference planes, and the BGA pad 290. As a result, there is no overlap between the BGA pad 290 and the reference plane 270 and hence, the via capacitance $C_{via}$ is reduced.

A problem exists in this alternative via structure, however, in that the structure becomes mechanically weak due to the large areas 202 and 205 of dielectric material where no metal material is provided. In the structure shown in FIG. 1A, because there is an overlap of metal structures, i.e. the BGA pad 190 and the metal reference layers 150-170, the structure is mechanically strong with regard to forces that may be exerted on the multilayer interconnection substrate 100, such as when placing external integrated circuit devices in contact with the BGA pad 190 and/or placing the multilayer interconnection substrate 100 on a printed circuit board. In addition, the structural stability at the BGA pad 190 is critical since most of the mechanical forces resulting from thermal cycling of the interconnect between the package and board ensue from the BGA ball located at this connection point. However, with the alternative structure shown in FIG. 2, the lack of metal in areas 202 and 205 makes the overall structure susceptible to fracture when a force is applied to the multilayer interconnection substrate 200.

SUMMARY

The illustrative embodiments provide an electrically optimized and structurally protected via structure for high speed signals in multilayer interconnection substrates, such as printed circuit boards (PCBs), multilayer organic (MLO) packages, multilayer ceramic (MLC) packages, or the like. The via structure in accordance with the illustrative embodiments eliminates the overlap of the ball grid array (BGA) pad with the reference planes to thereby reduce the via capacitance and therefore, the via impedance mismatch in the via structure. As a result, the via structure is electrically optimized.

The via structure further comprises one or more floating support members placed in close proximity to the via. These floating support members may be provided in a via clearance area between the via and reference planes. The floating support members are "floating" in the sense that they are not in electrical contact with either the via or the reference planes. Thus, they are not provided for purposes of signal propagation but only for structural support.

The floating support members, in one illustrative embodiment, may be provided, for example, as one or more circular rings of metal material encircling the via. Alternatively, other types of material may be used for fabricating the one or more floating support members, even though the fabrication process may be more difficult than a conventional fabrication process. For example, any non-metal material having a similar coefficient of thermal expansion to the metal materials, e.g., copper, that may be used in the fabrication of the floating support members may be used. In one illustrative embodiment, the floating support members comprise a plurality of metal rings encircling the via, each metal ring being provided at a different layer of the multilayer interconnection substrate. In such an embodiment, the floating support members may be provided in parallel with the reference planes of the multilayer interconnection substrate.

In illustrative embodiments in which multiple floating support members are provided, the floating support members may be connected to adjacent floating support members using one or more floating microvia structures. The floating microvias, as with the floating support members, are "floating" in that they are not connected to the signal propagation via or the reference planes and thus, are not provided for signal propagation purposes. To the contrary, the floating microvias provide additional structural support both in a direction parallel with the reference planes and, because they connect the floating support members, in a direction perpendicular to the reference planes. The floating support members provide additional structure support primarily in a direction perpendicular to the reference planes.

In one illustrative embodiment, a multilayer device is provided that comprises at least one reference plane, a via connecting at least one layer in the multilayer device with at least one other layer in the multilayer device, and at least one floating support member provided in a via clearance area of the multilayer device. The via clearance area is an area between the via and the at least one reference plane where the via does not contact the at least one reference plane. This via clearance area may comprise a dielectric material. The floating support member may not be electrically connected to the via or the at least one reference plane.

The at least one floating support member may have a ring configuration. The at least one floating support member may encircle the via. Moreover, the at least one floating support member may comprise a plurality of floating support members connected by way of one or more floating microvia structures. Furthermore, the at least one floating support member may be fabricated using a structurally rigid material, such as a metal material, or the like.

The multilayer device may further comprise a contact provided on one surface of the multilayer device. Within the multilayer device there is approximately zero capacitance affect between the contact and the at least one reference plane. The contact may be positioned relative to the at least one reference plane such that there is approximately zero overlap of the contact with the at least one reference plane.

The multilayer device may be one of a multilayer organic (MLO) package, multilayer ceramic (MLC) package, or a printed circuit board (PCB). The at least one floating support member may provide structural support in the via clearance area against an external force applied to the multilayer device.

In yet another illustrative embodiment, a method of making a multilayer device is provided. The method may comprise providing at least one reference plane, providing a via connecting at least one layer in the multilayer device with at least one other layer in the multilayer device, and providing at least one floating support member provided in a via clearance area. The via clearance area is an area between the via and the at least one reference plane where the via does not contact the at least one reference plane. The via clearance area may comprise a dielectric material. The floating support member may not be electrically connected to the via or the at least one reference plane.

The at least one floating support member may have a ring configuration. The at least one floating support member may encircle the via. Moreover, the at least one floating support member may comprise a plurality of floating support members connected by way of one or more floating microvia structures. Furthermore, the at least one floating support member may be fabricated using a structurally rigid material, such as a metal material, or the like.

The method may further comprise providing a contact on one surface of the multilayer device. Within the multilayer device there may be approximately zero capacitance affect between the contact and the at least one reference plane. The contact may be positioned relative to the at least one reference plane such that there is approximately zero overlap of the contact with the at least one reference plane.

The multilayer device may be one of a multilayer organic (MLO) package, multilayer ceramic (MLC) package, or a printed circuit board (PCB). The at least one floating support member may provide structural support in the via clearance area against an external force applied to the multilayer device.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide a via structure that is electrically optimized and structurally protected. The via structure and method of manufacturing the via structure as described hereafter may be used in the fabrication of integrated circuit chips, multilayer organic (MLO) packages, multilayer ceramic (MLC) packages, printed circuit boards (PCBs), or any other device that utilizes via structures to electrically connect layers of the device. For purposes of the following description of the illustrative embodiments, it will be assumed that the via structure is utilized with a MLO package. However, the same structures described herein may be used with any multilayer interconnection substrate and are not limited to MLO packages.

While the following description of the illustrative embodiments will make reference to particular structural elements, it should be appreciated that the structural elements mentioned and their configurations are only exemplary. Many modifications to the illustrative embodiments may be made without departing from the spirit and scope of the present invention.

For example, the following description will make reference to ball grid array (BGA) pads as contacts for electrically connecting the via structure to external devices, however the present invention is not limited to such. Rather, any electrical contact suitable to the particular implementation may be used with the via structure of the present invention. Other modifications, as will be readily apparent to those of ordinary skill in the art in view of the description provided herein, may be made without departing from the spirit and scope of the present invention.

Figure 3A:
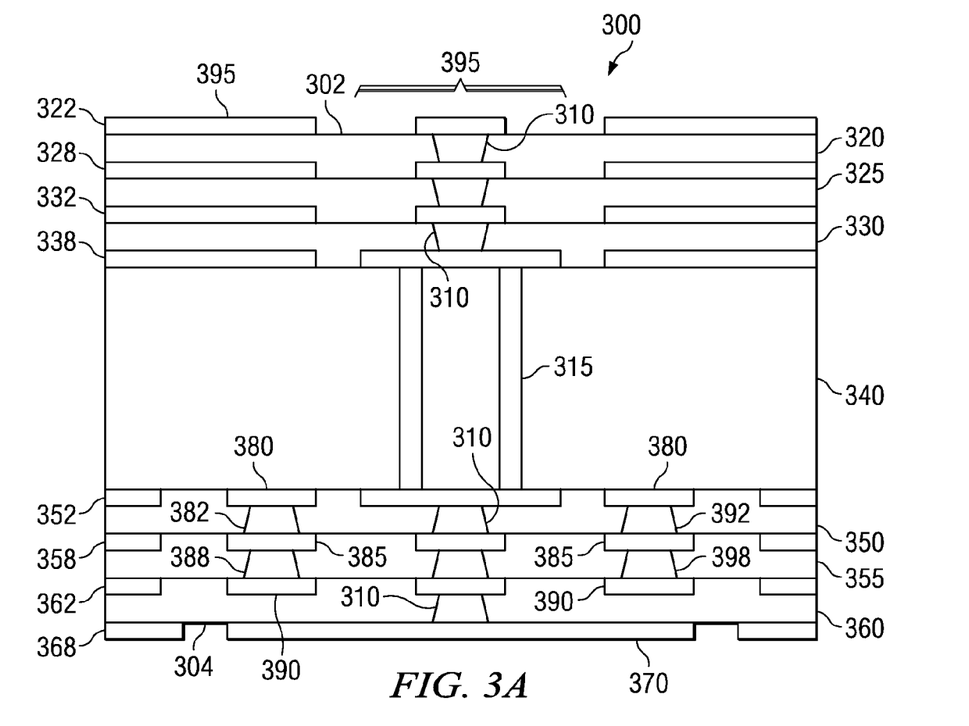
FIGS. 3A and 3B are exemplary cross sectional diagrams illustrating a via structure in accordance with one illustrative embodiment.
Figure 3B:
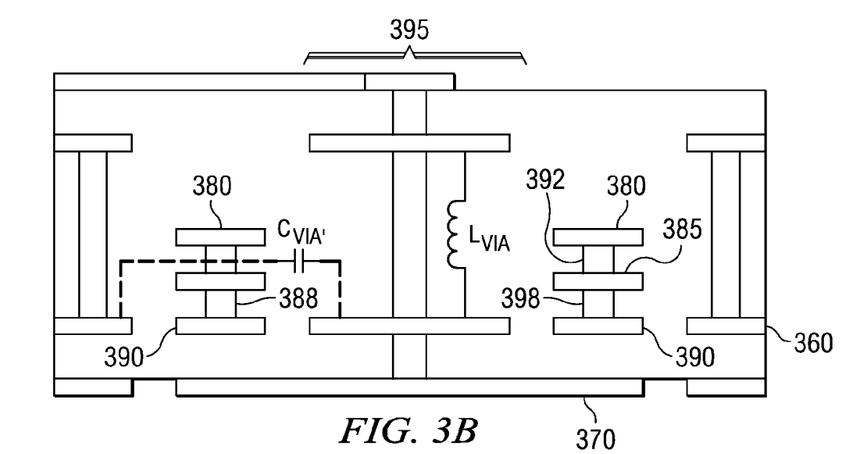

FIGS. 3A and 3B are exemplary cross sectional diagrams illustrating a via structure in accordance with one illustrative embodiment. FIG. 3A is a detailed cross-sectional diagram depicting the structural arrangement of the via structure in accordance with one illustrative embodiment while FIG. 3B is a more simplified cross-sectional view of the via structure for purposes of illustrating the difference in electrical characteristics of the via structure when compared to known via structures.

As shown in FIG. 3A, the via structure 395 according to one illustrative embodiment includes a plurality of microvias 310 which are provided in each of the build up layers 320, 325, 330, 350, 355, and 360. A plated through hole (PTH) 315 is provided in the core layer 340. The via structure 395 connects signal transmission wiring on a first surface 302 of the multilayer device 300 with a contact 370 on a second surface 304 of the multilayer device 300. In one exemplary embodiment, the contact 370 is a ball grid array (BGA) pad 370.

The build up layers 320, 325, and 330 provide substrates upon which signal planes 322, 328, 332, and 338 are provided having signal transmission wiring. The build up layers 350, 355, and 360 provide substrates upon which voltage and ground reference planes 352, 358, 362, and 368 may be provided. Such layers are generally known in the art.

Contrary to the via structure described with regard to FIGS. 1A and 1B above, the via arrangement shown in FIG. 3A does not have any overlap of the contact 370, e.g., BGA pad 370, and the reference planes 352, 358, 362, and 368. Rather, a "hole" in the conductive reference planes 352, 358, and 362 that has a width or diameter greater than the width or diameter of the contact 370 is provided and may be filled with a dielectric material. As a result, via clearance areas comprising the dielectric material are created between the via structure 395 and the reference planes 352, 358, 362, and 368, as represented by the areas encompassed by dashed lines in FIG. 3A.

In addition to the dielectric material, one or more floating support members 380, 385, and 390 may be provided in this "hole" created in the conductive reference planes 352, 358, and 362. The one or more floating support members 380, 385 and 390 may further have one or more associated floating microvia structures 382, 388, 392, and 398. In the depicted example, these support members and microvia structures are provided within the width or diameter of the contact 370, however, such an arrangement is not required.

The term "floating" is used in the present description to mean that the elements are not electrically connected to other elements in the structure. Thus, for example, the floating support members 380, 385, and 390 and floating microvia structures 382, 388, 392, and 398 are not electrically connected to either the signal transmission via structure 395 or the reference planes 352, 358, and 362 in the depicted example.

The floating support members 380, 385, and 390, as well as the floating microvia structures 382, 388, 392, and 398, may be made of any suitable structurally rigid material that may provide support for the dielectric material in the hole created in the conductive reference planes 352, 358, and 362. In one illustrative embodiment, such a suitable material may be a metal material, such as copper, or the like. Alternatively, other types of material may be used for fabricating the one or more floating support members, even though the fabrication process may be more difficult than a conventional fabrication process. For example, any non-metal material having a similar coefficient of thermal expansion to the metal materials, e.g., copper, that may be used in the fabrication of the floating support members may be used without departing from the spirit and scope of the present invention.

In the depicted example, the floating support members 380, 385, and 390 are provided as rings that encircle the signal transmission via structure 395. While a ring structure is utilized in the illustrative embodiments, the present invention is not limited to such a configuration. Rather, the floating support members may have any configuration determined to be suitable to the particular implementation. For example, other geometric configurations, such as hexagonal configurations, may be utilized without departing from the spirit and scope of the present invention. Moreover, each of the floating support members may not be one integrated piece but instead may be multiple pieces of floating material, such as two half-moon shaped floating pieces or parts.

Furthermore, the floating support structures may have different widths and thicknesses depending upon the particular implementation. The resulting firmness of the overall multilayer structure can be primarily decided by the portion of the via clearance area that is filled with the floating support structures.

The floating support members 380, 385, and 390 provide rigidity to the region of dielectric material in the hole created in the reference planes 352, 358, and 362. Thus, when an outside force is applied to the depicted multilayered device, the floating support members 380, 385, and 390 are able to absorb this externally applied force and prevent fracturing of the dielectric material. In this way, the via structure depicted in FIG. 3A is able to achieve a similar structural robustness as the structure illustrated in FIGS. 1A and 1B above, but without the negative affects of mismatched impedance, as discussed hereafter.

With reference now to FIG. 3B, with the via structure of the illustrative embodiments, rather than the relatively large via capacitance $C_{via}$ affect due to overlap of the BGA pad with the reference plane as in the structure of FIGS. 1A and 1B, the structure of the illustrative embodiments has a relatively small via capacitance $C_{via}'$ affect between the via structure 395 and the reference plane 360 due to the presence of the floating support members 380, 385, and 390 and floating microvia structures 382, 388, 392, and 398. Due to this relatively small capacitive affect in the via structure 395, the mismatch of impedance values through the via structure 395 is minimized. As a result, the via structure 395 is electrically optimized due to the large via clearance between the via structure 395 and the reference plane 360, and is structurally robust due to the added rigid material of the floating support members 380, 385, and 390 and floating microvia structures 382, 388, 392, and 398.

Figure 4:
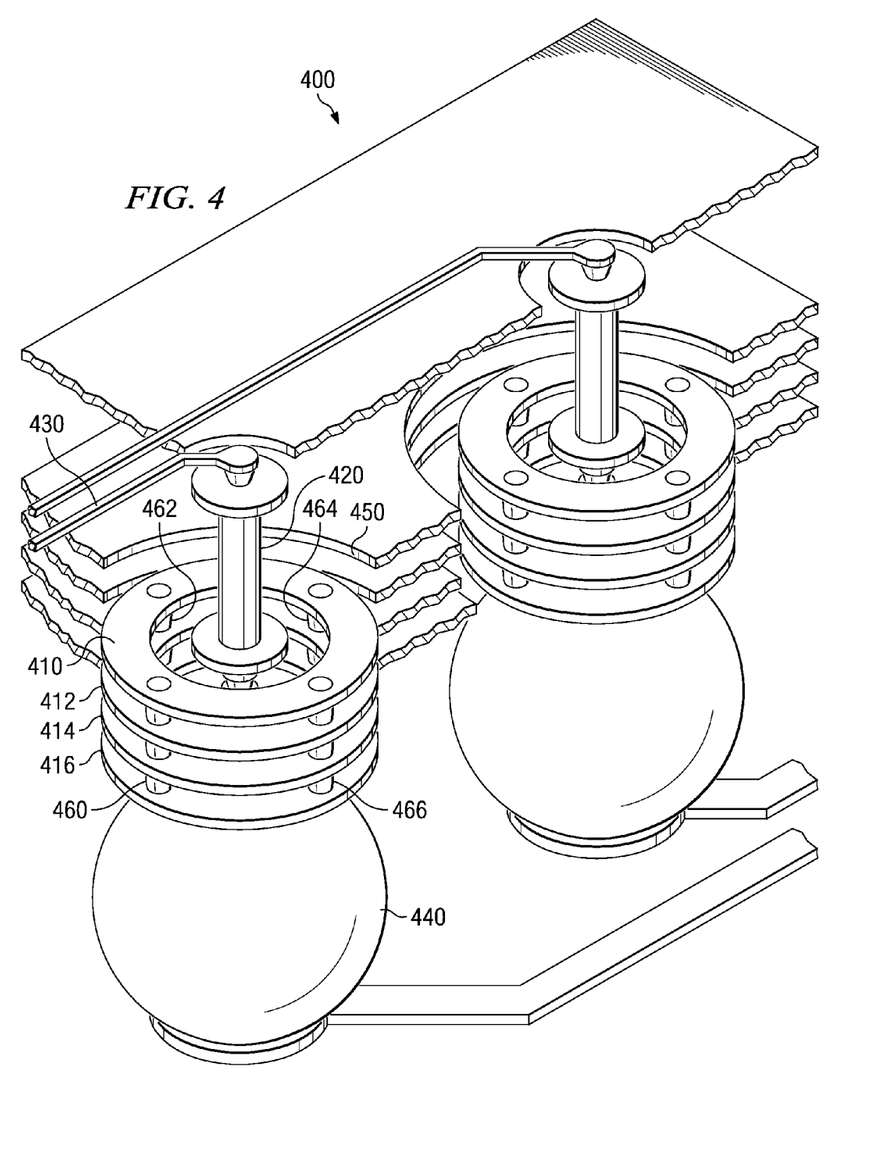
FIG. 4 is an exemplary isometric view of a via structure in accordance with one illustrative embodiment.

FIG. 4 is an exemplary isometric view of a via structure in accordance with one illustrative embodiment. The isometric view of FIG. 4 illustrates the ring configuration of the floating support members in accordance with one illustrative embodiment. In the depicted example, three floating support members 410-414 are provided in a ring configuration encircling a via structure 420 that connects a signal transmission line 430 in a signal layer of the multilayer structure 400 to a BGA element 440 via a BGA pad 416. The multiple layers are not shown in FIG. 4 in order to make the via structure more visible. The floating support members 410-414 are connected to adjacent floating support members using floating microvia structures 460-466.

The outer rings 450 shown around floating support members 410-414 represent the "hole" created in the reference planes which is filled with dielectric material. As shown, in FIG. 4, the floating support members 410-414 and floating microvia structures 460-466 are provided within the area of the "hole" 450. That is, the "hole" has a greater diameter than the diameter of the ring floating support members 410-416. Thus, the floating support members 410-414 and floating microvia structures 460-466 provide additional structural support in the area of the "hole" where the dielectric material may be relatively structurally weak.

It should be appreciated that while FIGS. 3A-3B, and FIG. 4 illustrate a via arrangement in which there are three floating support members, the present invention is not limited to any particular number of floating support members. Preferably, the number of floating support members is equal to the number of reference planes provided in the overall device, however the present invention is not limited to such. Rather, any number of floating support members, and floating microvia structures, may be used without departing from the spirit and scope of the present invention.

Figure 5:
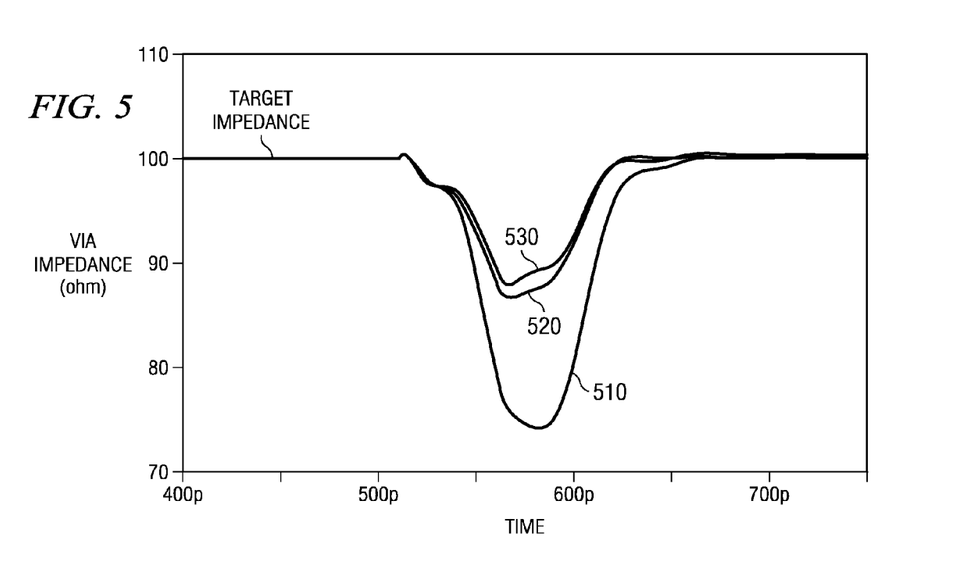
FIG. 5 is a diagram illustrating a graph depicting an impedance comparison of the various via structures shown in FIGS. 1-4 above.

FIG. 5 is a diagram illustrating a graph depicting an impedance comparison of the various via structures shown in FIGS. 1-4 above. It is assumed in the graph of FIG. 5 that the target impedance for the via structure is 100 ohms, although this is only exemplary and is not intended to be limiting to the present invention.

The various curves of the graph show the deviation from the target impedance for each of the known via structures and the via structure according to the illustrative embodiments over time. Curve 510 represents the conventional via structure illustrated in FIGS. 1A and 1B. Curve 530 represents the conventional via structure with no overlap of the BGA pad and the reference planes as illustrated in FIG. 2. Curve 520 represents the via structure according to the illustrative embodiments set forth herein.

As shown in FIG. 5, the conventional via structure, i.e. curve 510, provides the greatest deviation from the target impedance. The conventional via structure with no overlap of the BGA pad with the reference plane, i.e. curve 530, provides the least deviation from the target impedance. The via structure according to the illustrative embodiments, i.e. curve 520, provides a deviation from the target impedance that closely approximates that of the conventional via structure with no overlap represented by curve 530. The deviation in impedance for the via structure of the illustrative embodiments is slightly greater than that of the conventional via structure with no overlap (curve 530) but is significantly less than the conventional via structure (curve 510). Moreover, it has been determined that the via structure of the illustrative embodiments closely approximates the same s parameters, i.e. the parameters measuring reflection of power and attenuation, as with the conventional via structure with no overlap. Thus, the via structure of the illustrative embodiments provides the structural support of the conventional via structure while achieving an impedance deviation from the target impedance that approximates that of the conventional via structure with no overlap.

The multilayer device, e.g., a multilayer organic (MLO) package, multilayer ceramic (MLC) package, printed circuit board (PCB), or the like, incorporating the via structure of the illustrative embodiments may be fabricated using any known, or later developed, fabrication process. Just as one example, the following is a description of one possible fabrication methodology that may be utilized to produce a structure such as that described above. It should be appreciated that this is only one exemplary fabrication methodology and many modifications to this methodology may be made without departing from the spirit and scope of the present invention.

In one known multilayer ceramic package fabrication process, the process involves the formation of green or unfired ceramic layers or sheets, formation of a conductive paste, screening of the conductive paste onto the green ceramic sheets, and stacking, laminating and firing of ceramic sheets into the final multilayer ceramic structure. These general processes are known in the art and are described, for example, in U.S. Pat. No. 2,966,719 issued to Park.

The ceramic green sheet is formed by weighing out the proper portions of ceramic powder and glass frit, and blending the particles by ball or other milling techniques. An organic binder comprising a thermoplastic resin, plasticizer and solvents is then mixed and blended with the ceramic and glass powders on a ball mill. A slurry or slip is cast into a tape form by extruding or doctor blading. The cast sheet is then allowed to be dried of the solvent constituent in the binder system. After the tape is completely dried, it is then cut into working blanks or sheets.

Registration holes are formed in the blanks together with the via holes which are selectively punched in the working blanks. The via holes are eventually be filled with a conductive composition to allow for electrical connections from layer to layer in the multilayer interconnection substrate. The floating support members and floating microvia structures may be formed in the area surrounding the via holes by way of a circuitization process, such as photolithography and etching or the like, such as is used in the formation of PCBs, MLO packages, and the like.

The wiring layers in the multilayer interconnection substrate may be designed in a stacked triplate configuration with the signal wiring sandwiched between upper and lower reference planes (typically alternating in vdd/gnd polarity). These reference structures may be meshed in a regular grid structure to allow via interconnections for the signal and power lines. This triplate structure is a controlled impedance environment that allows high speed signal propagation.

The via structure and method of manufacturing the via structure as described above may be used in the fabrication of integrated circuit chips, multilayer organic packages, multilayer ceramic packages, printed circuit boards, or any other device that utilizes via structures to electrically connect layers of the device. In the case of integrated circuit chips, the resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a organic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of making a multilayer device, comprising:
   in a layer of the multilayer device, providing at least one reference plane, wherein the at least one reference plane is either a voltage plane or a ground connection plane;
   providing in the layer a plurality of vies connecting the layer in the multilayer device with at least one other layer in the multilayer device, wherein the layer has a via clearance area between the associated with each via in the plurality of vies, the via clearance area providing a space between an associated via in the plurality of vias and the at least one reference plane such that the associated via does not contact the at least one reference plane, the via clearance area comprising a dielectric material; and
   providing at least one a floating support member in each via clearance area in the layer between the associated via in the plurality of vies and the at least one reference plane, wherein: the floating support member encircles the associated via in the plurality of vies, wherein the floating support member is not electrically connected to the associated via or the at least one reference plane, and the floating support member is not .electrically connected to the at least one reference plane, wherein the at least one floating support member has a ring configuration in the layer.

2. The method of claim 1, wherein the floating support member comprises a plurality of floating support members in a plurality of layers of the multilayer device and wherein the plurality of floating support members are connected by way of one or more floating microvia structures.

3. The method of claim 1, wherein the at least one floating support member is fabricated using a structurally rigid material.

4. The method of claim 1, wherein the at least one floating support member is fabricated using a metal material.

5. The method of claim 1, further comprising providing a contact on one surface of the multilayer device.

6. The method of claim 5, wherein there is approximately zero capacitance affect between the contact and the at least one reference plane.

7. The method of claim 5, wherein the contact is positioned relative to the at least one reference plane such that there is approximately zero overlap of the contact with the at least one reference plane.

8. The method of claim 1, wherein the multilayer device is one of a multilayer organic (MLO) package, multilayer ceramic (MLC) package, or a printed circuit board (PCB).

9. The method of claim 1, wherein the at least one floating support member provides structural support in the via clearance area against an external force applied to the multilayer device.

10. The method of claim 1, wherein the via clearance area between the via and the at least one reference plane is formed such that the via does not contact any reference plane in the multilayer device.

11. The method of claim 1, wherein the via connects signal transmission wiring on one layer of the multilayer device with a contact on a second layer of the multilayer device, wherein the contact is a ball grid array (BGA) pad.

12. A method of making a multilayer device, comprising:

in a layer of the multilayer device, providing at least one reference plane, wherein the at least one reference plane is either a voltage plane or a ground connection plane;

providing in the layer a plurality of vias connecting the layer in the multilayer device with at least one other layer in the multilayer device, wherein the layer has a via clearance area between the associated with each via in the plurality of vias, the via clearance area providing a space between an associated via in the plurality of vias and the at least one reference plane such that the associated via does not contact any reference plane in the multilayer device, the via clearance area comprising a dielectric material; and providing at least one a floating support member in each via clearance area in the layer between the associated via in the plurality of vias and the at least one reference plane, wherein: the floating support member encircles the associated via in the plurality of vias, wherein the floating support member is not electrically connected to the associated via or the at least one reference plane, the floating support member is not electrically connected to the at least one reference plane, and wherein the at least one floating support member provides structural support in the via clearance area against an external force applied to the multilayer device, wherein the at least one floating support member has a ring configuration in the layer.

* * * * *